United States Patent [19]
McLean et al.

[11] Patent Number: 5,926,150
[45] Date of Patent: Jul. 20, 1999

[54] COMPACT BROADBAND ANTENNA FOR FIELD GENERATION APPLICATIONS

[75] Inventors: James McLean; Gentry Crook, both of Austin, Tex.

[73] Assignee: Tactical Systems Research, Inc., Austin, Tex.

[21] Appl. No.: 09/020,227

[22] Filed: Feb. 6, 1998

Related U.S. Application Data

[60] Provisional application No. 60/055,509, Aug. 13, 1997.

[51] Int. Cl.⁶ .................................................. H01Q 1/48
[52] U.S. Cl. ................... 343/846; 343/795; 343/700 MS
[58] Field of Search ........................... 343/846, 795, 343/793, 749, 751, 792.5, 810, 867, 742, 700 MS; H01Q 1/48, 9/28

[56] References Cited

U.S. PATENT DOCUMENTS

| | | | |
|---|---|---|---|
| 4,506,267 | 3/1985 | Harmuth | 343/846 |
| 5,365,246 | 11/1994 | Rasinger et al. | 343/702 |
| 5,434,579 | 7/1995 | Kagoshima et al. | 343/700 |

OTHER PUBLICATIONS

S. J. Porter & A. C. Marvin, "A New Broadband EMC Antenna for Emissions and Immunity", International Symposium on Electromagnetic Compatibility, Sep. 13–16, 1994, Rome, Italy.

*Primary Examiner*—Don Wong
*Assistant Examiner*—Hoang Nguyen
*Attorney, Agent, or Firm*—Taylor Russell & Russell, P.C.

[57] ABSTRACT

A compact, broadband antenna derived from the inverted-F antenna configuration is disclosed. The tapered inverted-F antenna (TIFA) is able to generate high intensity electric fields with a physically small package size, making it particular useful for electromagnetic compatibility testing applications. This antenna derives its broadband characteristics from the combination of a number of unique features. The TIFA utilizes radiating elements that are broadband planar frames or planar sheets. The planar frames provide extended performance at low frequencies and may also include an interior lattice structure of various configurations. The novel use of triangular or "bowtie" elements for the feed and shunt elements of the TIFA provides extended performance at high frequencies. When suitably configured and properly matched to a log-periodic dipole array, the antenna is capable of providing high intensity electric fields with a very wide useful bandwidth. The invention may be configured in either an unbalanced or a balanced configuration.

45 Claims, 6 Drawing Sheets

COMPACT BROADBAND ANTENNA FOR FIELD GENERATION APPLICATIONS

RELATED APPLICATIONS

This application claims the benefit of U.S. Provisional Application No. 60/055,509, filed on Aug. 13, 1997.

BACKGROUND

The present invention relates generally to compact broadband antennas and, more particularly, to compact, electrically-small broadband antennas for field generation applications that are derived from an inverted-F antenna configuration. The present invention also relates to these antennas when further combined with antennas derived from a log-periodic array antenna configuration for extending the bandwidth of the combined configuration.

In many applications, and in particular Electromagnetic Compatibility (EMC) testing applications, it is desirable to have a compact broadband antenna for generating high intensity electric fields. A typical application may require an antenna that is capable of generating an electric field intensity of 20 volts per meter over a frequency range of from 20 MHz to 2 GHz at a distance of 3 meters in front of the antenna using an amplifier having the least possible power to feed the antenna. At the low end of this frequency range, a compact antenna will necessarily be electrically small. (An antenna is commonly considered to be electrically small if it fits inside a sphere of radius $1/2\pi$ wavelengths of the lowest frequency of interest. An antenna with a lower frequency of interest of 20 MHz would be electrically small if it fit inside a sphere with a radius of less than 2.4 meters. A practical manageable size for an antenna that must be set up for a test and subsequently disconnected and removed from a test chamber is about 1.5 meters in extent.) Unfortunately, electrically small antennas are inherently narrowband and inefficient, so that design of a compact antenna, in either a conventional or hybrid combination configuration, having high electric field intensities over a useful range of from 20 MHz to 2 GHz has eluded those skilled in the field of antenna design.

Frequency-independent antennas, and in particular, log-periodic dipole arrays (LPDAs) are widely used for applications requiring the generation of broadband electromagnetic fields. However, at the lower end of their operating frequency range (the frequency range over which they exhibit frequency-independent behavior), these antennas must be approximately one-half of a wavelength in width. Thus, an LPDA with a lower operating frequency of 30 MHz (10 meter wavelength) must be approximately 5 meters wide. Because such dimensions are unacceptably large and because operating frequency ranges extending from 20 MHz to 2 GHz are required by the electromagnetic compatibility (EMC) testing industry, techniques for reducing the size of hybrid antennas have been sought. One commonly used technique to extend the frequency range of a LPDA downward is to use a broadband dipole to replace the lowest frequency element in a LPDA. For example, a bowtie dipole element is sometimes used in conjunction with a 150 MHz LPDA to extend the low frequency response of the antenna down to 30 MHz. Another possibility is to use a biconical dipole element to replace the lowest frequency element. However, none of these configurations are capable of achieving a usable bandwidth from about 20 MHz to about 2 GHz required for EMC testing without being driven by prohibitively large amplifiers. Examples of LPDAs are described in the following U.S. Pat. Nos.: 4,754,287 and 5,057,850.

Size reduction in linear antennas has been obtained by "folding" a vertical resonant quarter-wave monopole antenna into an "inverted-L" shape. The length needed for resonant operation is thus obtained as the sum of the two dimensions, height and length, as opposed to just height. While the inverted-L antenna is a useful reduced-size antenna, it suffers from low input impedance and thus requires an external matching network which adds complexity and reduces efficiency and power handling capability. The overall length allows the antenna to resonate and thus provide zero input reactance. However, the reduced height causes the radiation resistance at the fundamental resonance to be unacceptably small.

The inverted-F antenna is essentially a tapped inverted-L antenna. That is, the antenna is tapped at some non-zero distance from the base in order to provide a broadband impedance transformation. This impedance transformation is derived from the current distribution in the antenna which can be assumed to vary in a sinusoidal manner along the arc length as measured from the base. Thus, any impedance level may be obtained by adjusting the tap position. The inverted-F antenna is superior to the inverted-L antenna because it requires no external matching network and allows independent adjustment of the resonant frequency of the antenna and impedance level. In general, the overall length of the inverted-F antenna (height plus length) must be approximately one-quarter wavelength at the resonant frequency. The planar inverted-F antenna (PIFA) is a derivative of the inverted-F antenna in which the top wire is replaced with a plate. This has been shown to lower the radiation Q and hence broaden the frequency response of the antenna while still retaining the desirable characteristics of the wire inverted-F antenna: no required external impedance transformer and independent adjustment of resonant frequency and impedance level. While having many desirable characteristics, the planar inverted-F antenna still lacks the requisite bandwidth to allow implementation of a compact hybrid antenna for EMC testing. Examples of PIFAs are described in the following U.S. Pat. Nos.: 5,365,246 and 5,434,579.

While currently available hybrid antennas are superior to LPDA antennas alone, they are still ineffective at the low-frequency end of their operating range. This unsatisfactory performance at the low-frequency end imposes severe amplifier requirements for electric field generating systems. Because the amplifier is generally the most costly component of the system, relaxing amplifier performance requirements would have a significant effect on system cost.

For the foregoing reasons, there is a need for a small size antenna capable of generating high electric field intensities over the frequency range of from 20 MHz to 2 GHz. Specifically, there is a need for an antenna that is capable of achieving the desired electric field intensity of at least 20 volts per meter at a distance of 3 meters in front of the antenna using an amplifier having an output power of less than 500 watts to feed the antenna. Because of practical considerations, the dimensional extent of the antenna should not exceed 1.5 meters. In order to achieve a small size while maintaining a wide bandwidth, a broadband, electrically-small antenna can be mated with a frequency independent antenna. The primary problem is to obtain the necessary bandwidth from the electrically-small antenna. The secondary problem is to properly mate the electrically-small antenna to the LPDA or other frequency-independent antenna. That is, the frequency characteristics of the antennas should "cross-over" in such a way that destructive interference does not occur. It is also important that coupling between the antennas does not detract from the beam pattern of the LPDA or other frequency-independent antenna.

SUMMARY

The present invention is directed to a new, compact, electrically-small broadband antenna derived from the inverted-F antenna configuration. This new antenna is referred to as a "tapered inverted-F antenna" (TIFA) from the shape of the antenna feed and shunt elements. The antenna derives its broadband characteristics from the use of novel, inherently broadband radiating elements and from proper use of the loading and impedance transforming properties of the inverted-F configuration. One embodiment of the present invention is capable of generating electric field intensities of greater than 20 volts per meter at a distance of 3 meters in front of the antenna using a 500 Watt amplifier over a frequency range of from 20 MHz to 200 MHz. This embodiment is about 1.3 meters long, 1.3 meters wide, and 0.75 meters high. Another embodiment of the present invention combines the tapered inverted-F antenna configuration with a log-periodic dipole array (LPDA) to provide electric field intensities in excess of 20 volts per meter at a distance of 3 meters in front of the antenna over an extended frequency range of from 20 MHz to 2 GHz using a 500 Watt amplifier. This performance may be achieved with no increase in package size since the LPDA may be placed within the perimeters of the TIFA. Because of the novel geometry of the TIFA, high power loading elements may be used to achieve a power handling capability of up to 2 kW.

The present invention utilizes radiating elements that are broadband planar frames (wire-grids) or planar sheets. The planar frames provide extended performance at low frequencies, and may also include an interior lattice structure of various configurations. The novel use of triangular or "bowtie" elements for the feed and shunt elements of the TIFA provides extended performance at high frequencies.

The present invention also takes advantage of the inverting-F configuration's versatility in reactive loading to lower the resonant frequency to one below that for which the overall length is one-quarter wavelength. Either end of the antenna may be loaded. In general, an inductive load should be used at the shorted or base end of the antenna, and a capacitive load should be used at the open end. Note that resistive loading may be used within the antenna elements for further improvement at lower frequencies. It is usually more convenient to load the antenna at the base end. Loaded inverted-F antenna configurations have the advantage of allowing adjustment of the resonant frequency by adjusting the load(s) while the impedance level can be adjusted by relocating the input or feed tap. The fact that the reactive loading element is not located at the input (feed) for this configuration is particularly useful when the TIFA is combined with an LPDA. In this case, mechanical considerations allow the load to be physically larger when not at the connection point between the LPDA and the broadband antenna element, which allows for improved power handling. The inductive loading element may also be shunted with a "swamping" resistor in order to limit the maximum VSWR to a usable value without significantly reducing the radiation efficiency. The antenna configuration also utilizes radiating elements that are broadband planar frames (wire-grids) or planar sheets. The planar frames may also include an interior lattice structure of various configurations to provide extended performance at the low frequencies. The use of triangular or "bowtie" elements for the feed and shunt elements provide extended performance at high frequencies.

The LPDA and the TIFA may be configured in either a single-ended or unbalanced configuration or in a double-ended or balanced configuration. In the unbalanced configuration, the ground plane is used as a counterpoise. In the balanced configuration, the mirror image of the unbalanced configuration is the counterpoise. All of the advantages inherent in the unbalanced antennas are retained in the balanced configurations.

A compact broadband antenna, having features of the present invention comprises an electrically conductive ground plane with a first radiating means for radiating and receiving electromagnetic radiation, having a first edge and an opposing second edge, positioned in a parallel relationship with the ground plane. A second radiating means for radiating and receiving electromagnetic radiation has a triangular shape and has a base and an opposing apex, with the second radiating means base being connected to the first edge and the second radiating means apex is connected to the ground plane. A third radiating means for radiating and receiving electromagnetic radiation has a triangular shape and has a base and an opposing apex, with the third radiating means base being connected to the first radiating means between the first and second edge.

In an alternative embodiment, the compact broadband antenna further comprises a back loading element interposed between the second radiating means apex and the ground plane. The back loading element may be any combination of circuit elements, but is usually an inductor or a parallel combination of an inductor and a resistor.

In an alternative embodiment, the compact broadband antenna further comprises a distributed load within the first radiating means, within the second radiating means, and within the third radiating means. The distributive load is usually resistive.

In an alternative embodiment, the compact broadband antenna further comprises a front loading element between the first radiating means second edge and the ground plane. The front loading element is usually capacitive.

In an alternative embodiment, the first radiating means, the second radiating means, and the third radiating means of the compact broadband antenna are planar sheets.

In an alternative embodiment, the first radiating means, the second radiating means, and the third radiating means of the compact broadband antenna are planar frames.

In an alternative embodiment, the compact broadband antenna further comprises a monopole array positioned between the first radiating means and the ground plane.

In an alternative embodiment, a compact broadband antenna comprises a ground plane having an electrically conductive planar surface and a rectangular shaped first planar electromagnetic radiator having a first edge and an opposing second edge, spaced apart from and parallel to the ground plane. A second triangular shaped planar electromagnetic radiator having a base and an opposing apex, is positioned perpendicular to the ground plane and the first rectangular radiator, with the base of the second triangular radiator connected to the first edge of the first rectangular radiator and the apex of the second triangular radiator connected to the ground plane. A third triangular shaped planar electromagnetic radiator having a base and an opposing apex, is positioned perpendicular to the ground plane and the first rectangular radiator and parallel to the second triangular radiator, with the base of the third triangular radiator connected to the first rectangular radiator between the first edge and the opposing second edge. A feed connection comprises a first connecting point connected to the apex of the third triangular radiator and a second connecting point on the ground plane.

In an alternative embodiment, the compact broadband antenna further comprises a back loading element interposed between the apex of the second triangular radiator and the ground plane.

In an alternative embodiment, the first rectangular radiator, the second triangular radiator, and the third triangular radiator of the compact broadband antenna are metallic planar sheets.

In an alternative embodiment, the first rectangular radiator, the second triangular radiator, and the third triangular radiator of the compact broadband antenna are metallic planar frames.

In an alternative embodiment, the first rectangular radiator, the second triangular radiator, and the third triangular radiator of the compact broadband antenna are lossy conductive planar sheets for providing a distributed load. The lossy conductive planar sheets are usually resistive conductors made from carbon or carbon fiber embedded resin material.

In an alternative embodiment, the first rectangular radiator, the second triangular radiator, and the third triangular radiator of the compact broadband antenna are lossy conductive planar frames for providing a distributed load. The lossy conductive planar frames are usually resistive conductors made from carbon or carbon fiber embedded resin material.

In an alternative embodiment, the first rectangular radiator of the compact broadband antenna is shaped so as to bend toward the ground plane near the second edge for providing a front loading element. The front loading element is usually capacitive.

In an alternative embodiment, the back loading element of the compact broadband antenna is selected from the group consisting of: an inductor; a parallel combination of an inductor and a resistor; a capacitor; a parallel combination of a capacitor and a resistor; a resistor; and a parallel combination of a resistor, an inductor, and a capacitor.

In an alternative embodiment, the feed connection of the compact broadband antenna further comprises an input coupling element in a series configuration between the first connecting point and the apex of the third triangular radiator, and an input shunt element connected between the first connecting point and the second connecting point. The input coupling element may be selected from the group consisting of a capacitor, a resistor, and an inductor. The input shunt element may be selected from the group consisting of a capacitor, a resistor, and an inductor.

In an alternative embodiment, the center of gravity of the antenna is located near the connection of the third triangular radiator and the first rectangular radiator.

In an alternative embodiment, the compact broadband antenna further comprises a monopole array having a first feeder transmission line and a second feeder transmission line extending in length from the feed connection to a radiating end of the antenna between the second edge of the first rectangular radiator and the ground plane. A plurality of monopoles extending axially from the first feeder transmission line and the second feeder transmission line toward the first rectangular radiator, are positioned perpendicular to the first rectangular radiator and the ground plane, and are alternately connected to the first feeder transmission line and the second feeder transmission line. The length of the monopoles and the spacing between the monopoles increases from a minimum at a position nearest the radiating end to a maximum at a position nearest the feed connection. An end of the first feeder transmission line nearest to the feed connection is connected to the first connecting point and an end of the second feeder transmission line nearest to the feed connection is connected to the second connecting point. The feeder transmission lines may be balanced lines, hybrid networks, or a transposition configuration to achieve a 180° phase shift between adjacent monopoles.

In an alternative embodiment, the end of the first feeder transmission line farthest from the feed connection of the compact broadband antenna is coaxially connected to the first connecting point and the end of the second feeder transmission line farthest from the feed connection is coaxially connected to the second connecting point.

In an alternative embodiment, a compact broadband antenna, comprises a first radiating means for radiating and receiving electromagnetic radiation, having a first edge and an opposing second edge. A second radiating means for radiating and receiving electromagnetic radiation, has a first edge and an opposing second edge and is positioned in a parallel relationship with the first radiating means. A third radiating means and a fourth radiating means for radiating and receiving electromagnetic radiation, each having a triangular shape and each having a base and an opposing apex, with the apex of the third radiating means connected to the apex of the fourth radiating means, and the third radiating means base is connected to the first radiating means first edge. The fourth radiating means base is connected to the second radiating means first edge. A fifth radiating means and a sixth radiating means for radiating and receiving electromagnetic radiation, each having a triangular shape and each having a base and an opposing apex, with the apex of the fifth radiating means opposite to the apex of the sixth radiating means. The fifth radiating means base is connected to the first radiating means between the first radiating means first edge and second edge, and the sixth radiating means base is connected to the second radiating means between the second radiating means first edge and second edge.

In an alternative embodiment, the compact broadband antenna further comprises a back loading element interposed between the third radiating means apex and the fourth radiating means apex. The back loading elements are usually inductors or a parallel combination of an inductor and a resistor.

In an alternative embodiment, the compact broadband antenna further comprises a distributed load within the first radiating means, within the second radiating means, within the third radiating means, within the fourth radiating means, within the fifth radiating means, and within the sixth radiating means. The distributed load is usually resistive.

In an alternative embodiment, the compact broadband antenna further comprises a front loading element between the first radiating means second edge and the second radiating means second edge. The front loading element is usually capacitive.

In an alternative embodiment, the first radiating means, the second radiating means, the third radiating means, the fourth radiating means, the fifth radiating means, and the sixth radiating means of the compact broadband antenna are planar sheets.

In an alternative embodiment, the first radiating means, the second radiating means, the third radiating means, the fourth radiating means, the fifth radiating means, and the sixth radiating means of the compact broadband antenna are planar frames.

In an alternative embodiment, the compact broadband antenna further comprises a dipole array positioned between the first radiating means and the second radiating means.

In an alternative embodiment, a compact broadband antenna, comprises a first rectangular shaped planar electromagnetic radiator having a first edge and an opposing second edge. A first triangular shaped planar electromagnetic radiator having a base and an opposing apex, is positioned perpendicular to the first rectangular radiator, with the base of the first triangular radiator connected to the first edge of the first rectangular radiator. A third triangular shaped planar electromagnetic radiator having a base and an opposing apex, is positioned perpendicular to the first rectangular radiator and parallel to the first triangular radiator, with the base of the third triangular radiator connected to the first rectangular radiator between the first edge and the opposing second edge of the first rectangular radiator. A second rectangular shaped planar electromagnetic radiator having the same dimensions as the first rectangular radiator and having a first edge and an opposing second edge, the second rectangular radiator is spaced apart from, parallel to, and coextensive with the first rectangular radiator. A second triangular shaped planar electromagnetic radiator having the same dimensions as the first triangular radiator and having a base and an opposing apex, is positioned perpendicular to the second rectangular radiator, with the base of the second triangular radiator connected to the first edge of the second rectangular radiator. A fourth triangular shaped planar electromagnetic radiator having the same dimensions as the third triangular radiator and having a base and an opposing apex, is positioned perpendicular to the second rectangular radiator and parallel to the second triangular radiator, with the base of the fourth triangular radiator connected to the second rectangular radiator between the first edge and the opposing second edge of the second rectangular radiator, the distance between the fourth triangular radiator and the second triangle radiator being equal to the distance between the third triangular radiator and the first triangular radiator. The second rectangular radiator is positioned opposite the first rectangular radiator with the first triangular radiator being coplanar with the second triangular radiator and the apex of the first triangular radiator is connected to the apex of the second triangular radiator, and with the third triangular radiator is coplanar with the fourth triangular radiator and the apex of the third triangular radiator is opposite the apex of the fourth triangular radiator. A feed connection comprises a first connecting point connected to the apex of the third triangular radiator and a second connecting point connected to the apex of the fourth triangular radiator.

In an alternative embodiment, the compact broadband antenna further comprises a back loading element interposed between the apex of the first triangular radiator and the apex of the second triangular radiator.

In an alternative embodiment, the compact broadband antenna further comprises a first back loading element interposed between the apex of the first triangular radiator and a ground voltage reference, and a second back loading element interposed between the apex of the second triangular radiator and the ground voltage reference. The first back loading element may be selected from the group consisting of: an inductor; a parallel combination of an inductor and a resistor; a capacitor; a parallel combination of a capacitor and a resistor; a resistor; and a parallel combination of a resistor, an inductor, and a capacitor. The second back loading element may be selected from the group consisting of: an inductor; a parallel combination of an inductor and a resistor; a capacitor; a parallel combination of a capacitor and a resistor; a resistor; and a parallel combination of a resistor, an inductor, and a capacitor.

In an alternative embodiment, the first rectangular radiator, the second rectangular radiator, the first triangular radiator, the second triangular radiator, the third triangular radiator, and the fourth triangular radiator of the compact broadband antenna are metallic planar sheets.

In an alternative embodiment, the first rectangular radiator, the second rectangular radiator, the first triangular radiator, the second triangular radiator, the third triangular radiator, and the fourth triangular radiator of the compact broadband antenna are metallic planar frames.

In an alternative embodiment, the first rectangular radiator, the second rectangular radiator, the first triangular radiator, the second triangular radiator, the third triangular radiator, and the fourth triangular radiator of the compact broadband antenna are lossy conductive planar sheets for providing a distributed load. The lossy conductive planar sheets are usually resistive conductors made from carbon or carbon fiber embedded resin material.

In an alternative embodiment, the first rectangular radiator, the second rectangular radiator, the first triangular radiator, the second triangular radiator, the third triangular radiator, and the fourth triangular radiator of the compact broadband antenna are lossy conductive planar frames for providing a distributed load. The lossy conductive planar frames are usually resistive conductors made from carbon or carbon fiber embedded resin material.

In an alternative embodiment, the first rectangular radiator is shaped so as to bend toward the second rectangular radiator of the compact broadband antenna near the second edge of the first rectangular radiator and the second rectangular radiator is shaped so as to bend toward the first rectangular radiator near the second edge of the second rectangular radiator for providing a capacitive load.

In an alternative embodiment, the feed connection of the compact broadband antenna further comprises: a first input coupling element in a series configuration between the first connecting point and the apex of the third triangular radiator; a second input coupling element in a series configuration between the second connecting point and the apex of the fourth triangular radiator; and an input shunt element connected between the first connecting point and the second connecting point. The first input coupling element may be selected from the group consisting of a capacitor, an inductor, and a resistor. The second input coupling element may be selected from the group consisting of a capacitor, an inductor, and a resistor. The input shunt element may be selected from the group consisting of a capacitor, an inductor, and a resistor.

In an alternative embodiment, the center of gravity of the antenna is located near the feed connection.

In an alternative embodiment, the compact broadband antenna further comprises a dipole array having a first feeder transmission line and a second feeder transmission line extending in length from the feed connection to a radiating end of the antenna between the second edge of the first rectangular radiator and the second edge of the second rectangular radiator. A plurality of dipoles connected to the first feeder transmission line and the second feeder transmission line, each dipole comprises a first monopole element and a second monopole element, each first monopole element extending in opposite directions from each second monopole element, with each first and second monopole elements extending axially from the first feeder transmission line and the second feeder transmission line, where each first monopole element extends toward and is positioned perpendicular to the first rectangular radiator and each second monopole element extends towards and is positioned perpendicular to the second rectangular radiator. The first monopole element of each dipole being alternately connected to the first feeder transmission line and the second feeder transmission line, and the second monopole element of each dipole being alternately connected to the second feeder transmission line and the first feeder transmission line, respectively. The length of the dipoles and the spacing between the dipoles increases from a minimum at a position nearest the radiating end to a maximum at a position nearest the feed connection. An end of the first feeder transmission line nearest to the feed connection is connected to the first connecting point and an end of the second feeder transmission line nearest to the feed connection is connected to the second connecting point. The feeder transmission lines may be balanced lines, hybrid networks, or a transposition configuration to provide a 180° phase shift between dipoles.

In an alternative embodiment, the end of the first feeder transmission line farthest from the feed connection is coaxially connected to the first connecting point and the end of the second feeder transmission line farthest from the feed connection is coaxially connected to the second connecting point of the compact broadband antenna.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
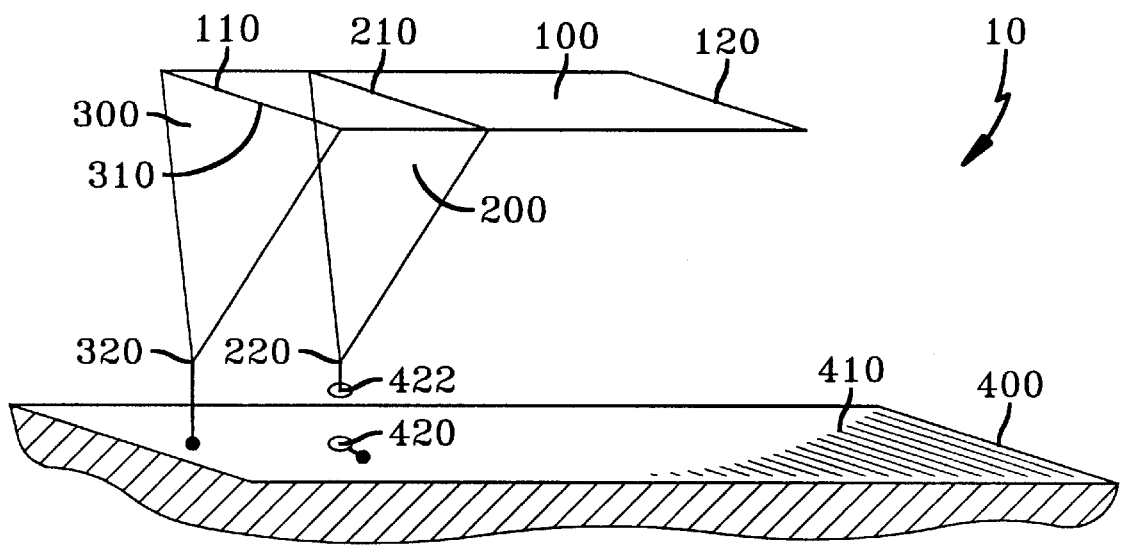
FIG. 1 shows a tapered inverted-F antenna in an unbalanced configuration with planar frame radiating elements, having a shunt element connected to a ground plane.

Turning now to FIG. 1, an embodiment of the compact broadband antenna is shown in accordance with the present inventive concepts. FIG. 1 shows a tapered inverted-F antenna 10 in an unbalanced configuration with planar frame radiating elements 100, 200, and 300. The compact broadband antenna 10 comprises a first radiating means in the form of a rectangular radiating element 100 that has a first edge 110 and an opposing second edge 120, and is positioned parallel to an electrically conductive ground plane 400. In a variation of this embodiment, the ground plane 400 is nonconductive but has an electrically conductive surface 410. A shunt radiating means in the form of a second triangular radiating element 300 that has a base 310 and an apex 320, is connected at its base 310 to the first edge 110 of the first radiating element 100. The apex 320 of the second triangular radiating element 300 is connected to the ground plane 400. A feed radiating means in the form of a third triangular radiating element 200 that has a base 210 and an apex 220, is connected at its base 210 to the first radiating element 100 between the first edge 110 and the second edge 120 of the first radiating element 100. A feed connection comprises a first connecting point 422 connected to the apex 220 of the third radiating element 200, and a second connecting point 420 connected to the ground plane 400. Other alternative embodiments include the first radiating element 100, the second radiating element 300, and the third radiating element 200 being either metallic planar frames or carbon fiber embedded resin planar frames that provide means for distributed resistive loading.

Figure 2:
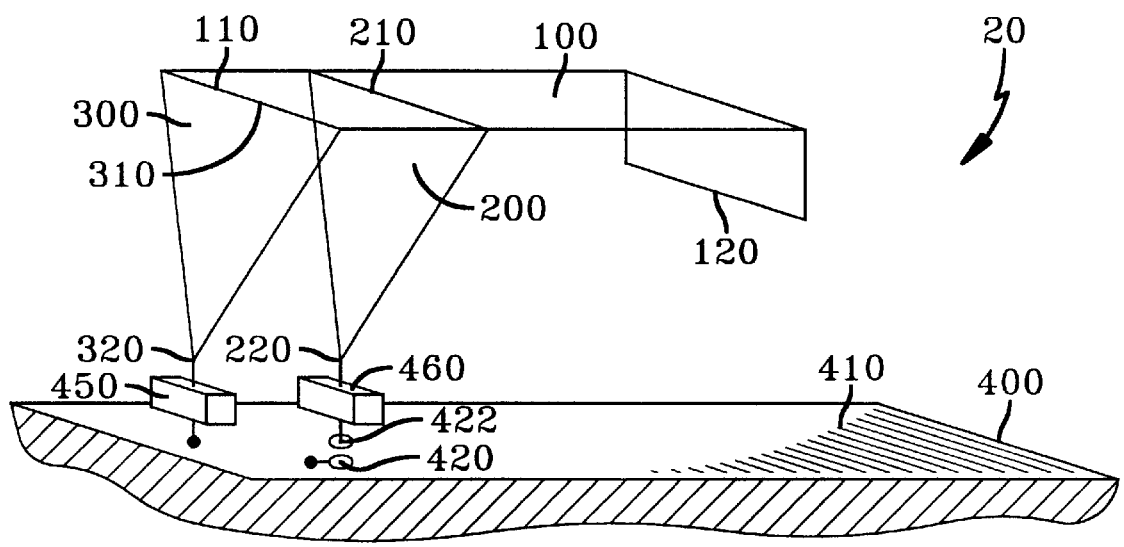
FIG. 2 shows a tapered inverted-F antenna in an unbalanced configuration with planar frame radiating elements, having a loaded shunt element, an input coupling capacitor, and a shaped rectangular element to provide a capacitive load.

FIG. 2 shows another embodiment of the invention in the form of a tapered inverted-F antenna in an unbalanced configuration 20 with planar frame radiating elements 100, 200, 300, having a loaded shunt element 300, an input coupling element 460, and a shaped rectangular element 100 to provide a capacitive load. FIG. 2 depicts a compact broadband antenna as shown in FIG. 1, but with the addition of a back loading element 450 connected between the apex 320 of the second radiating element 300 and the ground plane 400. The back loading element 450 may be any network configuration but is usually either an inductor or and inductor configured in a parallel connection with a "swamping" resistor in order to limit the maximum VSWR to a useable value without significantly reducing the radiation efficiency. Also shown in FIG. 2 is an input coupling element 460, usually a capacitor, connected between the apex 220 of the third radiating element 200 and the first connecting point 422. FIG. 2 also shows a first radiating element 100 that is shaped so as to bend toward the ground plane 400 near the second edge 120 for providing a front loading element, usually a capicative loading element.

Figure 3:
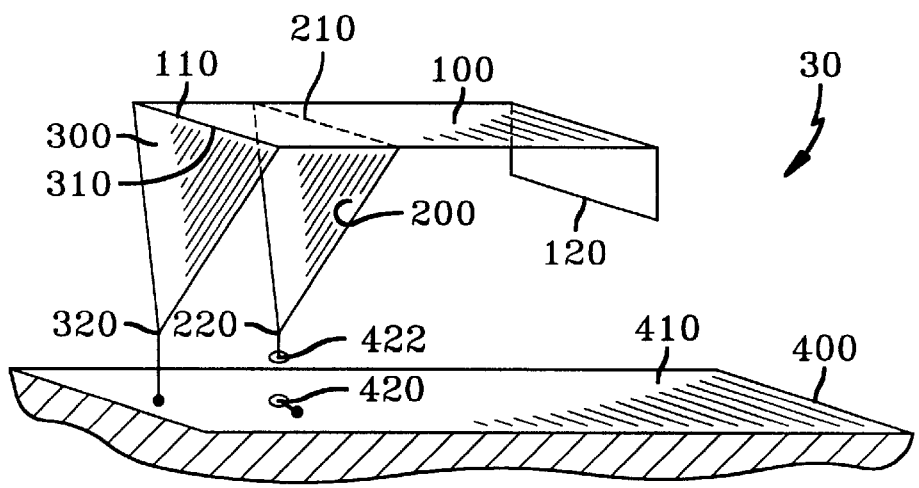
FIG. 3 shows a tapered inverted-F antenna in an unbalanced configuration with planar sheet radiating elements, having a shunt element connected to a ground plane and a shaped rectangular element to provide a capacitive load.

FIG. 3 shows a tapered inverted-F antenna in an unbalanced configuration 30 with planar sheet radiating elements, having a shunt element 300 connected to a ground plane and a shaped rectangular element 100 to provide a capacitive load. FIG. 3 shows an alternative embodiment to that shown in FIG. 1. In FIG. 3, the first radiating element 100, the second radiating element 300, and the fourth radiating element 200 are planar sheets. FIG. 3 also shows a first radiating element 100 that is shaped so as to bend toward the ground plane 400 near the second edge 120 in order to provide a capacitive load. Other embodiments of the invention shown in FIG. 3 include the first radiating element 100, the second radiating element 300, and the third radiating element 200 being either metallic planar sheets or carbon fiber embedded resin planar sheets that provide means for distributed resistive loading.

Figure 4:
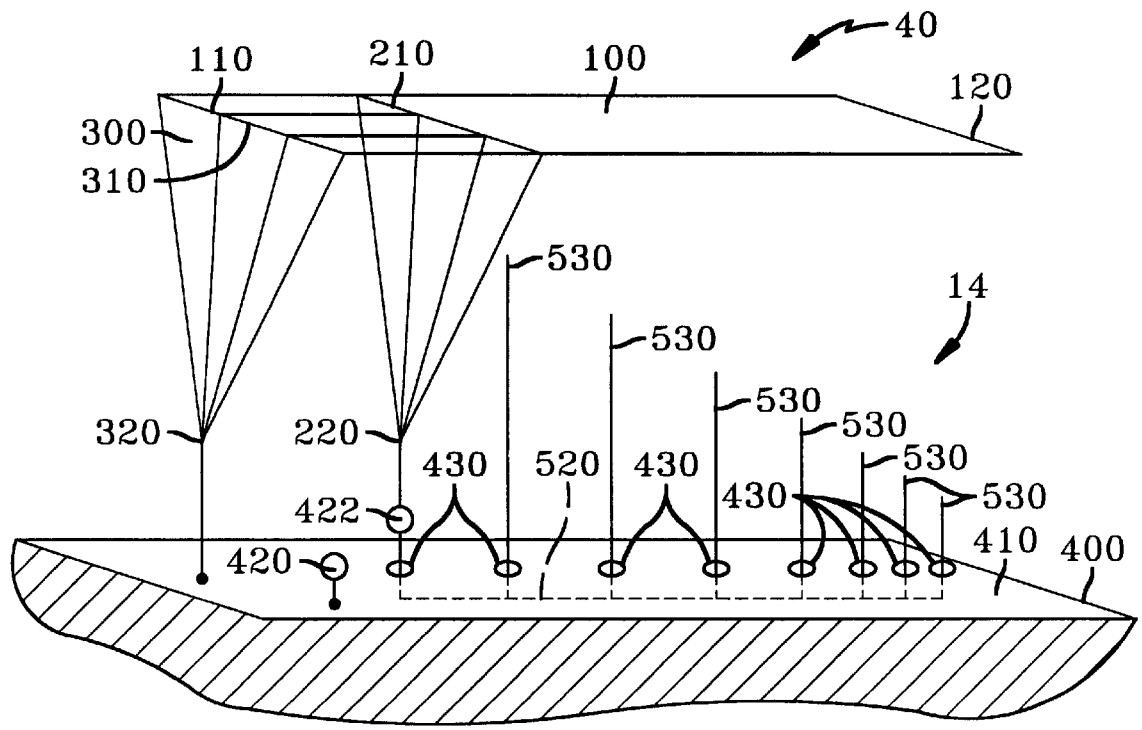
FIG. 4 shows a tapered inverted-F antenna in an unbalanced configuration with planar frame radiating elements, having a shunt element connected to a ground plane and a monopole array between a rectangular radiating element and a ground plane.

FIG. 4 shows a tapered inverted-F antenna in an unbalanced configuration 40 with planar frame radiating elements 100, 200, 300, having a shunt element 300 connected to a ground plane 400 and a monopole array 14 positioned between a rectangular radiating element 100 and a ground plane 400. Note that in addition to the monopole array 14, FIG. 4 differs from FIG. 1 in that the second radiating element 300, the third radiating element 200, and the portion of the first radiating element 100 between the base 310 of the second radiating element 300 and the base 210 of the third radiating element 200 have additional lattice structures within the planar frame radiating elements 100, 200, 300. The monopole array 14 comprises a a first feeder transmission line 520 and a second feeder transmission line 510 positioned parallel and adjacent to each other and the ground plane 400, and extending in length from the first feed connection 422 to a radiating end of the antenna between the second edge 120 of the first radiating element 100 and the ground plane 400. A plurality of monopoles 530 extend in an axial manner from the first feeder transmission line 520 and the second feeder transmission line 510 toward the first radiating element 100, and positioned perpendicular to the first radiating element 100. The monopoles 530 are alternately connected to the first feeder transmission line 520 and the second feeder transmission line 510. The length of the monopoles and the spacing between the monopoles increase from a minimum near the radiating end of the antenna to a maximum near the first connecting point 422. An end of the first feeder transmission line 520 nearest to the first connecting point 422 is connected to the first connecting point 422 and an end of the second feeder transmission line 510 nearest to the second connecting point 420 is connected to the second connecting point 420. In an alternate embodiment, the end of the first feeder transmission line 520 farthest from the first connecting point 422 is connected to the first connecting point 422 and an end of the second feeder transmission line 510 farthest from the second connecting point 420 is connected to the second connecting point 420.

Figure 5:
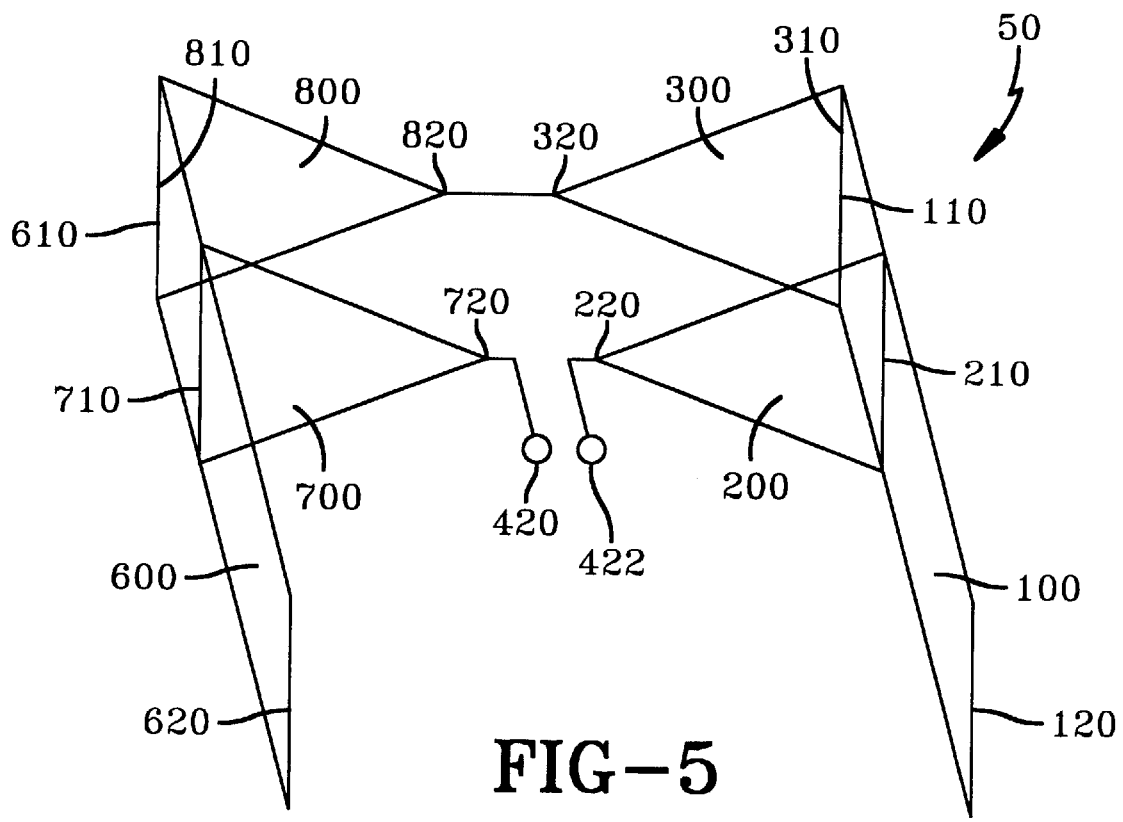
FIG. 5 shows a tapered inverted-F antenna in a balanced configuration with planar frame radiating elements, having the shunt elements connected together and a feed connection.

Turning now to FIG. 5, FIG. 5 shows a tapered inverted-F antenna 50 in a balanced configuration with radiating means comprising planar frame radiating elements 100, 200, 300, 600, 700, 800, having triangular shunt radiating elements 300, 800 connected together at an apex 320, 820. FIG. 5 is a balanced configuration of the unbalanced configuration shown in FIG. 1. The compact broadband antenna 50 comprises a first radiating means in the form of a first rectangular radiating element 100 that has a first edge 110 and an opposing second edge 120. A shunt radiating means in the form of a third triangular radiating element 300 that has a base 310 and an apex 320, positioned perpendicular to the first radiating element 100 and connected at its base 310 to the first edge 110 of the first radiating element 100. A feed radiating means in the form of a fifth triangular radiating element 200 that has a base 210 and an opposing apex 220, positioned perpendicular to the first radiating element 100 and parallel to the third radiating element 300 and connected at its base to the first radiating element 100 between the first edge 110 and the opposing second edge 120 of the first radiating element 100. The compact broadband antenna 20 also comprises a second radiating means in the form of a second rectangular radiating element 600 that has a first edge 610 and an opposing second edge 620. The second rectangular radiating element 600 is spaced apart from, positioned parallel to, and coextensive with the first rectangular radiating element 100. A shunt radiating means in the form of a fourth triangular radiating element 800 that has the same dimensions as the third triangular radiating element 300, a base 810 and an apex 820, positioned perpendicular to the second radiating element 600 and connected at its base 810 to the first edge 610 of the second radiating element 600. A feed radiating means in the form of a sixth triangular radiating element 700 that has the same dimensions as the fifth radiating element 200, a base 710 and an opposing apex 720, positioned perpendicular to the second radiating element 600 and parallel to the fourth radiating element 800 and connected at its base 710 to the second radiating element 600 between the first edge 610 and the opposing second edge 620 of the second radiating element 600. The distance between the fourth radiating element 800 and the sixth radiating element 700 is equal to the distance between the third radiating element 300 and the fifth radiating element 200. The second rectangular radiating element 600 is positioned opposite the first rectangular radiating element 100 with the third radiating element 300 coplanar with the fourth radiating element 800, and the apex 320 of the third radiating element 300 is connected to the apex 820 of the fourth radiating element 800. The second rectangular radiating element 600 is also positioned such that the fifth radiating element 200 is coplanar with the sixth radiating element 700, and the apex 220 of the fifth radiating element 200 is opposite the apex 720 of the sixth radiating element 700. There is also a feed connection which comprises a first connecting point 422 connected to the apex 220 of the fifth radiating element 200 and a second connecting point 420 connected to the apex 720 of the sixth radiating element 700. Other alternative embodiments include the radiating elements 100, 200, 300, 600, 700, 800 being either metallic planar frames or carbon fiber embedded resin planar frames that provide means for distributed resistive loading.

Figure 6:
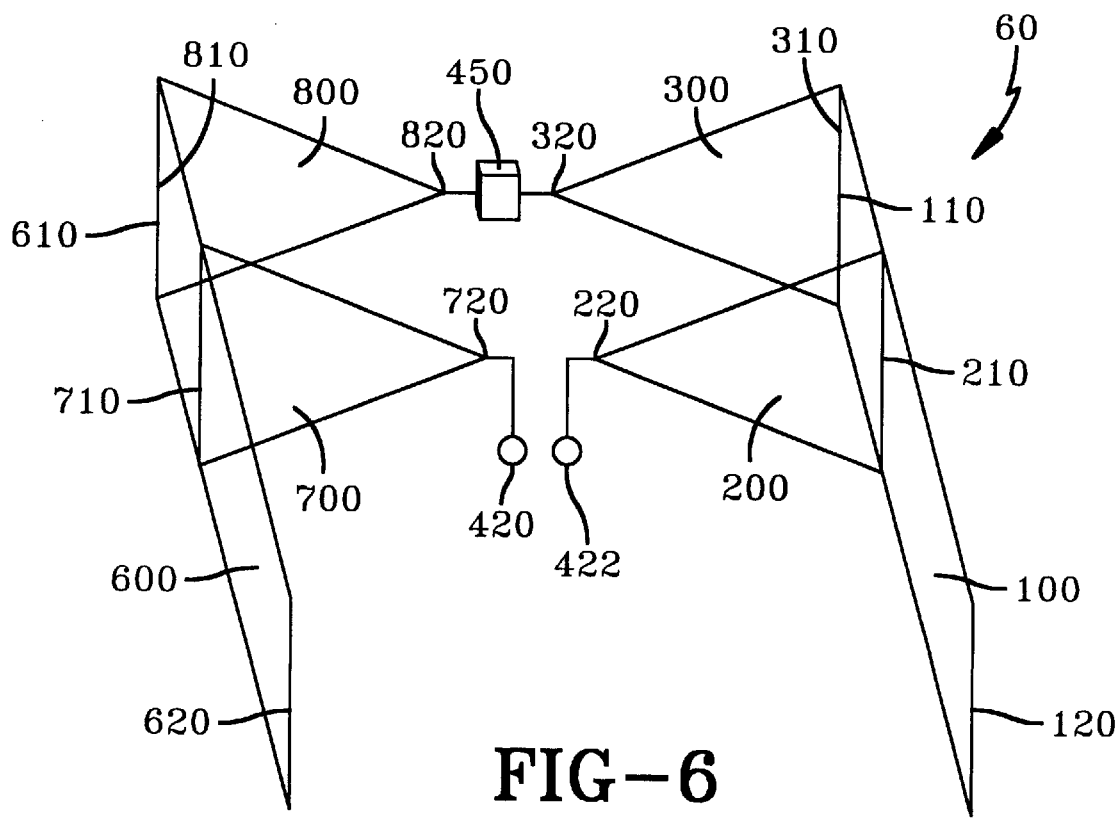
FIG. 6 shows a tapered inverted-F antenna in a balanced configuration with planar frame radiating elements, having a load between the shunt elements and a feed connection.

Another embodiment of the invention is depicted in FIG. 6, which shows a tapered inverted-F antenna in a balanced configuration 60, similar to that shown in FIG. 5, but with the addition of a back loading element 450 connected between the apex 320 of the third radiating element 300 and the apex 820 of the fourth radiating element 800. The back loading element may be any network configuration, but is usually an inductor or, alternatively, and inductor connected in parallel with a "swamping" resistor in order to limit the maximum VSWR to a useable value without significantly reducing the radiation efficiency.

Figure 7:
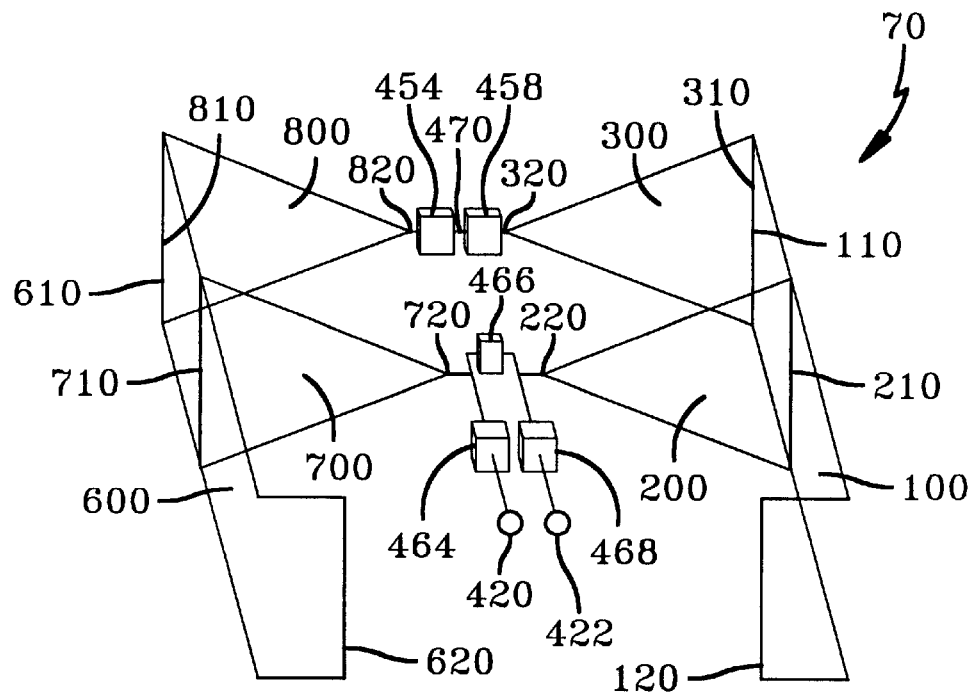
FIG. 7 shows a tapered inverted-F antenna in a balanced configuration with planar frame radiating elements, having balanced loads between the shunt elements and a ground voltage reference, capacitor coupling from the feed connection, and shaped rectangular elements to provide a capacitive load.

FIG. 7 shows a tapered inverted-F antenna in a balanced configuration 70 with planar frame radiating elements 100, 200, 300, 600, 700, 800, similar to FIG. 5, but having balanced back loading elements 454, 458 between the shunt elements 300, 800 and a ground voltage reference 470, input coupling elements 464, 468 from the feed connection, and shaped rectangular elements 100, 600 to provide a front loading element. The apex 320 of the third radiating element 300 is connected to a first back loading element 458 and a ground voltage reference 470. The apex 820 of the fourth radiating element 800 is connected to a second back loading element 454 and the ground voltage reference 470. The back loading elements 454, 458 may be any network configuration but are usually inductors or, alternatively, and inductors connected in parallel with "swamping" resistors in order to limit the maximum VSWR to a useable value without significantly reducing the radiation efficiency. FIG. 7 also shows a first input coupling element 468 connected between the apex 220 of the fifth radiating element 200 and the first connecting point 422, and a second input coupling element 464 connected between the apex 720 of the sixth radiating element 700 and the second connecting point 420. The input coupling elements may be any network configuration but are usually capacitors. FIG. 7 also depicts an input shunt element 466 connected between the apex 220 of the radiating element 200 and the apex 720 of the radiating element 700. The input shunt element nay be any network configuration. Also depicted in FIG. 7 is a first radiating element 100 that is shaped so as to bend toward the second radiating element 600 near the second edge 120 for providing a first front loading element, and a second radiating element 600 that is shaped so as to bend toward the first radiating element 100 near the second edge 620 for providing a second front loading element. These front loading elements are capacitive in nature.

Figure 8:
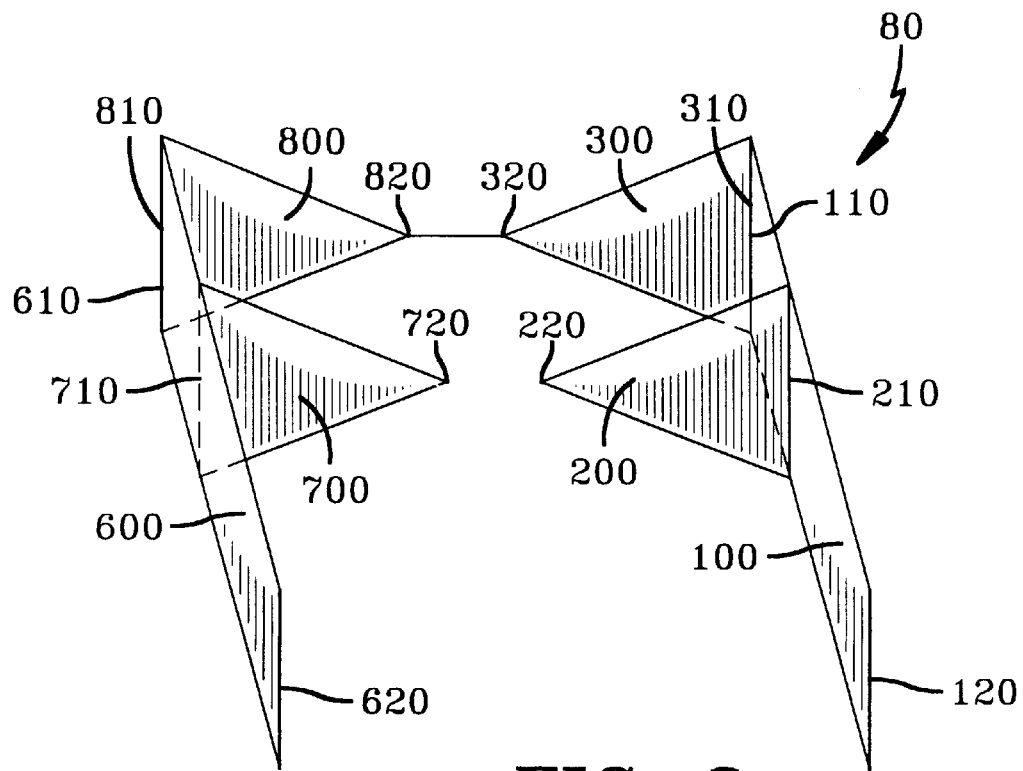
FIG. 8 shows a tapered inverted-F antenna in a balanced configuration with planar sheet radiating elements, having the shunt elements connected together.

In another embodiment of the invention shown in FIG. 1, FIG. 8 shows a tapered inverted-F antenna in a balanced configuration 80 with planar sheet radiating elements 100, 200, 300, 600, 700, 800 having the apex 320 of the shunt element 300 connected to the apex 820 of the shunt element 800. The planar sheet radiating elements 100, 200, 300, 600, 700, 800 may be made from any conductive or lossy conductive material, but are usually either metallic planar sheets or carbon fiber embedded resin planar sheets that provide for distributed resistive loading.

Figure 9A:
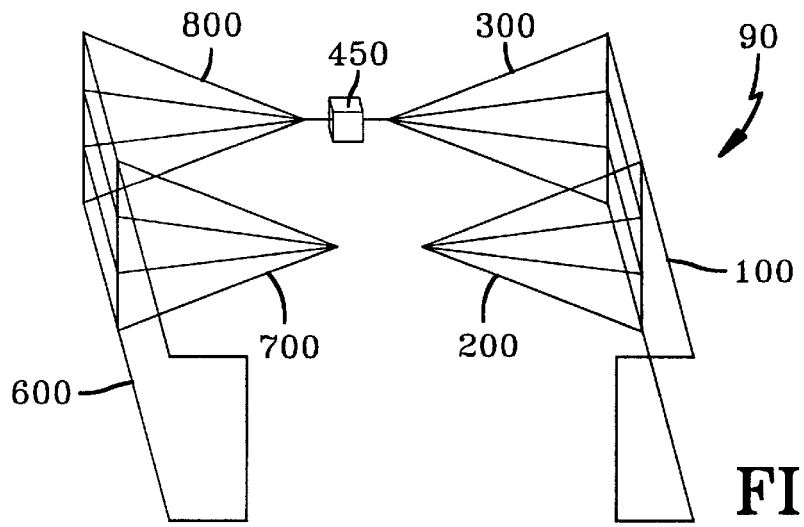
FIG. 9A, FIG. 9B, and FIG. 9C show tapered inverted-F antennas in a balanced configuration with planar frame radiating elements, having a load between the shunt elements, showing some of the possible combinations of planar frame lattice structures that may be configured.
Figure 9B:
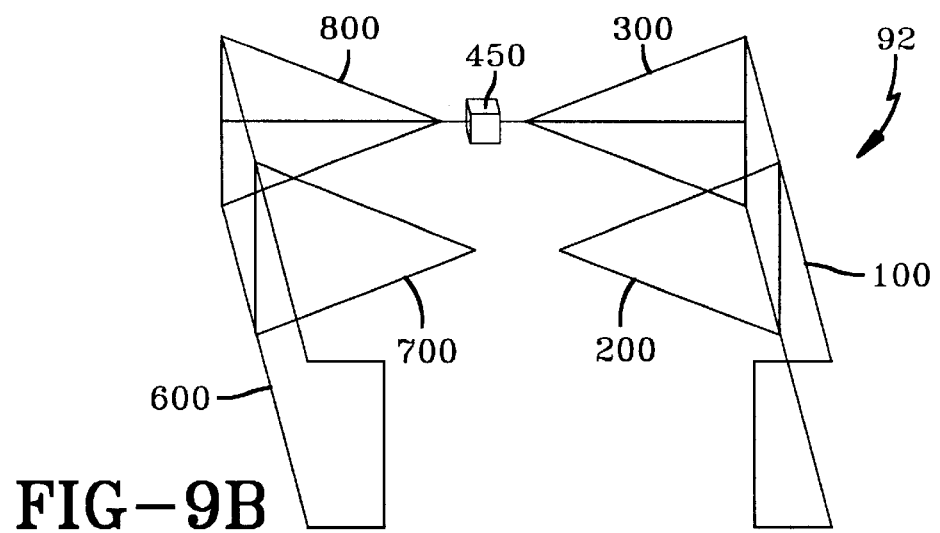
Figure 9C:
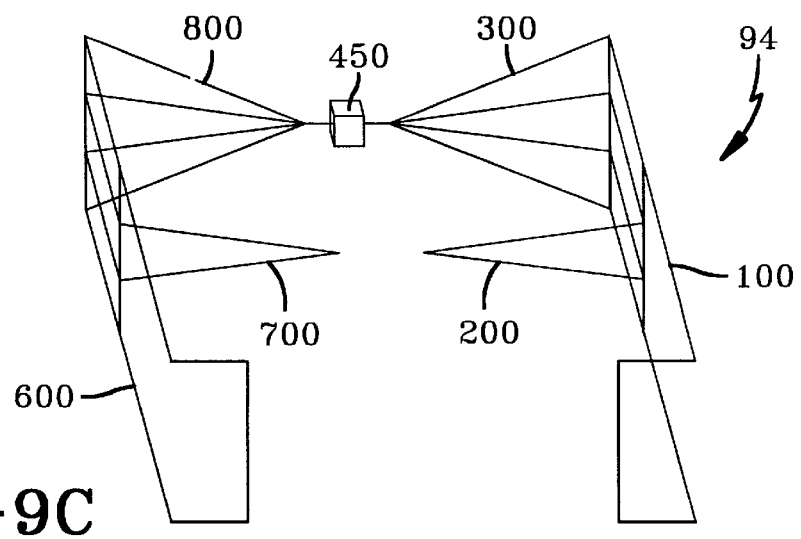

The invention may take a variety of alternative forms. Some of these alternatives include variations in the lattice structure of the radiating elements, as shown in FIG. 9A, FIG. 9B, and FIG. 9C. FIG. 9A shows an embodiment of the invention with additional lattice structure in the third radiating element 300, in the fifth radiating element 200, in the first radiating element 100 between the third radiating element 300 and fifth radiating element 200, in the fourth radiating element 800, in the sixth radiating element 700, and in the second radiating element 600 between the fourth radiating element 800 and the sixth radiating element 700. FIG. 9B shows additional lattice structure in the third radiating element 300 and in the fourth radiating element 800. FIG. 9C shows additional lattice structure in the third radiating element 300, in the fourth radiating element 800, in the first radiating element 100 between the third radiating element 300 and the fifth radiating element 200, and in the second radiating element 600 between the fourth radiating element 800 and the sixth radiating element 700, but with a fifth radiating element 200 and a sixth radiating element 700 that are reduced in size.

Figure 10:
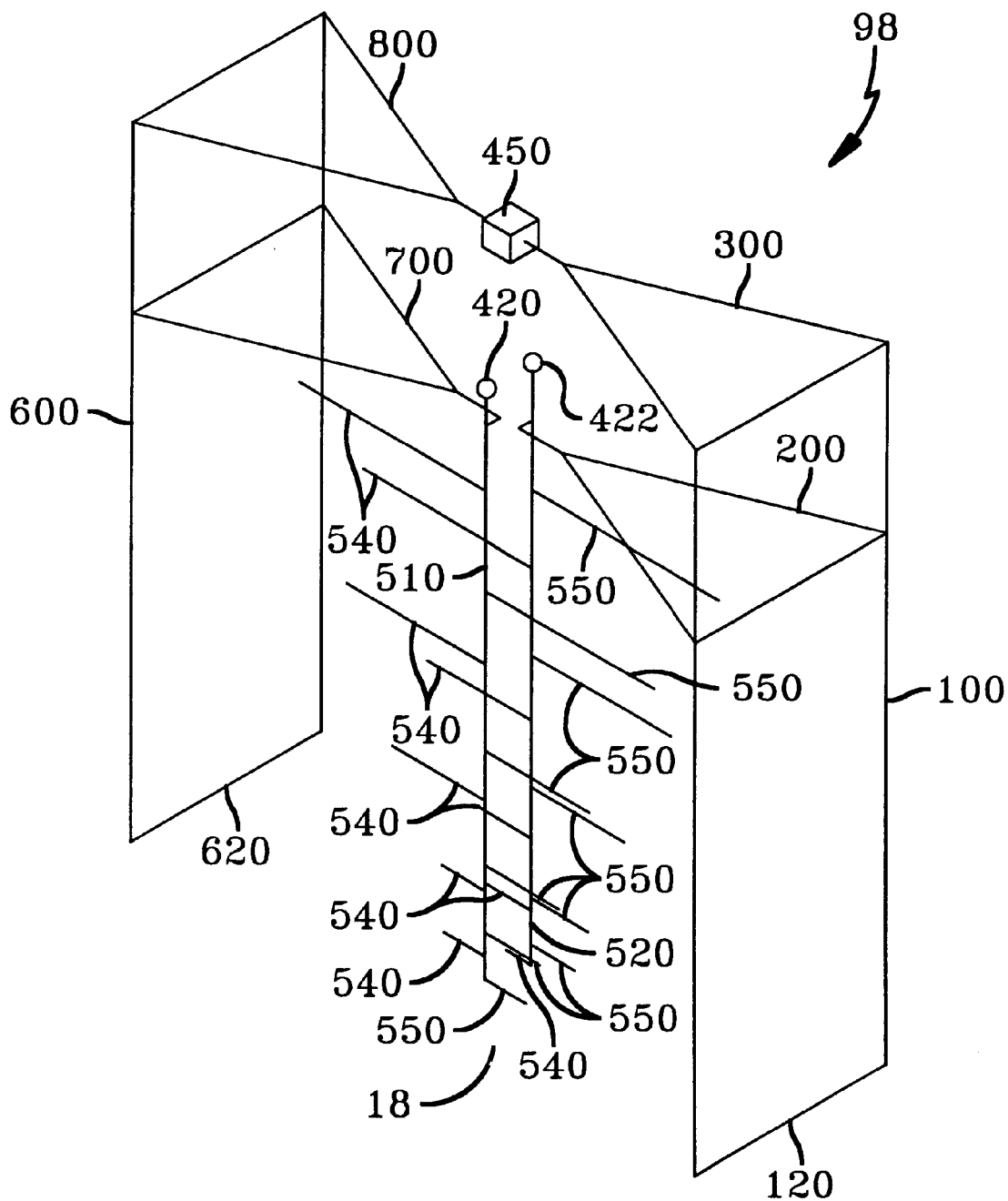
FIG. 10 shows a tapered inverted-F antenna in a balanced configuration with planar frame radiating elements, having a load between the shunt elements and having a log-periodic dipole array positioned between the rectangular radiating elements.

In another embodiment of the invention, FIG. 10 shows a tapered inverted-F antenna in a balanced configuration 98 with planar frame radiating elements 100, 200, 300, 600, 700, 800 and a back loading element 450 between the shunt elements 300, 800 and having a log-periodic dipole array 18 positioned between the rectangular radiating elements. This configuration is the same as that shown in FIG. 6 but with the addition of the log-periodic dipole array 18. The log-periodic dipole array 18 comprises a first feeder transmission line 520 and a second feeder transmission line 510 positioned parallel and adjacent to each other and equidistant between the first rectangular radiating element 100 and the second rectangular radiating element 600. The first feeder transmission line 520 and the second feeder transmission line 510 extend in length from the feed connection comprising the first connecting point 422 and the second connecting point 420, to the radiating end of the antenna between the second edge 120 of the first radiating element 100 and the second edge 620 of the second radiating element 600. A plurality of dipoles are connected to the feed lines, each dipole comprises a first monopole element 550 extending towards and positioned perpendicular to the first radiating element 100 and a second monopole element 540 extending towards and positioned perpendicular to the second radiating element 600, each first monopole element extending in the opposite direction from each second monopole element comprising a dipole. Each first monopole element 550 and each second monopole element 540 extend axially from the first feeder transmission line 520 and the second feeder transmission line 510, each first monopole element 550 being alternately connected to the first feeder transmission line 520 and the second feeder transmission line 510, and each second monopole element 540 being alternately connected to the second feeder transmission line 510 and the first feeder transmission line 520, respectively. The length of the dipoles and the spacing between the dipoles increase from a minimum at a position nearest the radiating end to a maximum at a position nearest the feed connection. The end of the first feeder transmission line 520 nearest to the feed connection is connected to the first connecting point 422 and the second feeder transmission line 510 nearest to the feed connection is connected to the second connecting point 420. In an alternative embodiment, the end of the first feeder transmission line 520 farthest from to the feed connection is connected to the first connecting point 422 and the second feeder transmission line 510 farthest from the feed connection is connected to the second connecting point 420.

Although the present invention has been described in considerable detail with reference to certain preferred versions thereof, other versions are possible. It should be understood that the embodiments described herein are merely exemplary and that many alternate embodiments and additional embodiments will become apparent to those skilled in the relevant art. Accordingly, such alternative embodiments are to be construed as being within the spirit of the present invention even though not explicitly set forth herein, the present invention being limited only by the content and scope of the claims appended hereto.

More specifically, it will be apparent that distortions in shape of the radiating elements such as flaring or tapering of the longitudinal elements, additional loading schemes such as resistive loading of the longitudinal elements to alter the current distribution on them, and additional coupling elements such as resistive input coupling, may be substituted for or added to the elements described herein while the same or similar results would be achieved. All such similar substitutes and modifications apparent to those of ordinary skill in the art are deemed to be within the spirit, scope and concept of the invention.

What is claimed is:

1. A compact broadband antenna, comprising:

(a) an electrically conductive ground plane;

(b) a first radiating means for radiating and receiving electromagnetic radiation, having a first edge and an opposing second edge, positioned parallel to the ground plane;

(c) a second radiating means for radiating and receiving electromagnetic radiation having a triangular shape and having a base and an opposing apex, the second radiating means base being connected to the first edge and the second radiating means apex being connected to the ground plane;

(d) a third radiating means for radiating and receiving electromagnetic radiation having a triangular shape and having a base and an opposing apex, the third radiating means base being connected to the first radiating means between the first and second edge.

2. A compact broadband antenna according to claim 1, further comprising a back loading element interposed between the second radiating means apex and the ground plane.

3. A compact broadband antenna according to claim 1, further comprising a distributed load within the first radiating means, within the second radiating means, and within the third radiating means.

4. A compact broadband antenna according to claim 1, further comprising a front loading element between the first radiating means second edge and the ground plane.

5. A compact broadband antenna according to claim 1, wherein the first radiating means, the second radiating means, and the third radiating means are planar sheets.

6. A compact broadband antenna according to claim 1, wherein the first radiating means, the second radiating means, and the third radiating means are planar frames.

7. A compact broadband antenna according to claim 1, further comprising a monopole array positioned between the first radiating means and the ground plane.

8. A compact broadband antenna, comprising:

(a) a ground plane having an electrically conductive planar surface;

(b) a rectangular shaped first planar electromagnetic radiator having a first edge and an opposing second edge, spaced apart from and parallel to the ground plane;

(c) a second triangular shaped planar electromagnetic radiator having a base and an opposing apex, positioned perpendicular to the ground plane and the first rectangular radiator, with the base of the second triangular radiator connected to the first edge of the first rectangular radiator and the apex of the second triangular radiator connected to the ground plane;

(d) a third triangular shaped planar electromagnetic radiator having a base and an opposing apex, positioned perpendicular to the ground plane and the first rectangular radiator and parallel to the second triangular radiator, with the base of the third triangular radiator connected to the first rectangular radiator between the first edge and the opposing second edge; and (e) a feed connection comprising a first connecting point connected to the apex of the third triangular radiator and a second connecting point on the ground plane.

9. A compact broadband antenna according to claim 8, further comprising a back loading element interposed between the apex of the second triangular radiator and the ground plane.

10. A compact broadband antenna according to claim 9, wherein the back loading element is selected from the group consisting of: an inductor; a parallel combination of an inductor and a resistor; a capacitor; a parallel combination of a capacitor and a resistor; a resistor; and a parallel combination of a resistor, an inductor, and a capacitor.

11. A compact broadband antenna according to claim 8, wherein the first rectangular radiator, the second triangular radiator, and the third triangular radiator are metallic planar sheets.

12. A compact broadband antenna according to claim 8, wherein the first rectangular radiator, the second triangular radiator, and the third triangular radiator are metallic planar frames.

13. A compact broadband antenna according to claim 8, wherein the first rectangular radiator, the second triangular radiator, and the third triangular radiator are lossy conductive planar sheets for providing a distributed load.

14. A compact broadband antenna according to claim 8, wherein the first rectangular radiator, the second triangular radiator, and the third triangular radiator are lossy conductive planar frames for providing a distributed load.

15. A compact broadband antenna according to claim 8, wherein the first rectangular radiator is shaped so as to bend toward the ground plane near the second edge for providing a front loading element.

16. A compact broadband antenna according to claim 8, wherein the feed connection further a comprises an input coupling element in a series configuration between the first connecting point and the apex of the third triangular radiator, and an input shunt element connected between the apex of the third triangular radiator and the ground plane.

17. A compact broadband antenna according to claim 16, wherein the input coupling element is selected from the group consisting of a capacitor, an inductor, and a resistor.

18. A compact broadband antenna according to claim 16, wherein the input shunt element is selected from the group consisting of a capacitor, an inductor, and a resistor.

19. A compact broadband antenna according to claim 8, wherein the center of gravity of the antenna is located near the connection of the third triangular radiator and the first rectangular radiator.

20. A compact broadband antenna according to claim 8, further comprising a monopole array having:

(a) a first feeder transmission line and a second feeder transmission line extending in length from the feed connection to a radiating end of the antenna between the second edge of the first rectangular radiator and the ground plane;

(b) a plurality of monopoles extending axially from the first feeder transmission line and the second feeder transmission line toward the first rectangular radiator, being positioned perpendicular to the first rectangular radiator and the ground plane, and being alternately connected to the first feeder transmission line and the second feeder transmission line;

(c) the length of the monopoles and the spacing between the monopoles increasing from a minimum at a position nearest the radiating end to a maximum at a position nearest the feed connection; and (d) an end of the first feeder transmission line nearest to the feed connection being connected to the first connecting point and an end of the second feeder transmission line nearest to the feed connection being connected to the second connecting point.

21. A compact broadband antenna according to claim 20, wherein the end of the first feeder transmission line farthest from the feed connection is coaxially connected to the first connecting point and the end of the second feeder transmission line farthest from the feed connection is coaxially connected to the second connecting point.

22. A compact broadband antenna, comprising:

(a) a first radiating means for radiating and receiving electromagnetic radiation, having a first edge and an opposing second edge;

(b) a second radiating means for radiating and receiving electromagnetic radiation, having a first edge and an opposing second edge and being positioned in a parallel relationship with the first radiating means;

(c) a third radiating means and a fourth radiating means for radiating and receiving electromagnetic radiation, each having a triangular shape and each having a base and an opposing apex, the apex of the third radiating means being connected to the apex of the fourth radiating means, the third radiating means base being connected to the first radiating means first edge, and the fourth radiating means base being connected to the second radiating means first edge;

(d) a fifth radiating means and a sixth radiating means for radiating and receiving electromagnetic radiation, each having a triangular shape and each having a base and an opposing apex, the apex of the fifth radiating means being opposite to the apex of the sixth radiating means, the fifth radiating means base being connected to the first radiating means between the first radiating means first edge and second edge, and the sixth radiating means base being connected to the second radiating means between the second radiating means first edge and second edge.

23. A compact broadband antenna according to claim 22, further comprising a back loading element interposed between the third radiating means apex and the fourth radiating means apex.

24. A compact broadband antenna according to claim 22, further comprising a distributed load within the first radiating means, within the second radiating means, within the third radiating means, within the fourth radiating means, within the fifth radiating means, and within the sixth radiating means.

25. A compact broadband antenna according to claim 22, further comprising a front loading element between the first radiating means second edge and the second radiating means second edge.

26. A compact broadband antenna according to claim 22, wherein the first radiating means, the second radiating means, the third radiating means, the fourth radiating means, the fifth radiating means, and the sixth radiating means are planar sheets.

27. A compact broadband antenna according to claim 22, wherein the first radiating means, the second radiating means, the third radiating means, the fourth radiating means, the fifth radiating means, and the sixth radiating means are planar frames.

28. A compact broadband antenna according to claim 22, further comprising a dipole array positioned between the first radiating means and the second radiating means.

29. A compact broadband antenna, comprising:

(a) a first rectangular shaped planar electromagnetic radiator having a first edge and an opposing second edge;

(b) a first triangular shaped planar electromagnetic radiator having a base and an opposing apex, positioned perpendicular to the first rectangular radiator, with the base of the first triangular radiator connected to the first edge of the first rectangular radiator;

(c) a third triangular shaped planar electromagnetic radiator having a base and an opposing apex, positioned perpendicular to the first rectangular radiator and parallel to the first triangular radiator, with the base of the third triangular radiator connected to the first rectangular radiator between the first edge and the opposing second edge of the first rectangular radiator;

(d) a second rectangular shaped planar electromagnetic radiator having the same dimensions as the first rectangular radiator and having a first edge and an opposing second edge, the second rectangular radiator being spaced apart from, parallel to, and coextensive with the first rectangular radiator;

(e) a second triangular shaped planar electromagnetic radiator having the same dimensions as the first triangular radiator and having a base and an opposing apex, being positioned perpendicular to the second rectangular radiator, with the base of the second triangular radiator connected to the first edge of the second rectangular radiator;

(f) a fourth triangular shaped planar electromagnetic radiator having the same dimensions as the third triangular radiator and having a base and an opposing apex, being positioned perpendicular to the second rectangular radiator and parallel to the second triangular radiator, with the base of the fourth triangular radiator connected to the second rectangular radiator between the first edge and the opposing second edge of the second rectangular radiator, the distance between the fourth triangular radiator and the second triangle radiator being equal to the distance between the third triangular radiator and the first triangular radiator;

(g) the second rectangular radiator being positioned opposite the first rectangular radiator with the first triangular radiator being coplanar with the second triangular radiator and the apex of the first triangular radiator being connected to the apex of the second triangular radiator, and with the third triangular radiator being coplanar with the fourth triangular radiator and the apex of the third triangular radiator being opposite the apex of the fourth triangular radiator; and (h) a feed connection comprising a first connecting point connected to the apex of the third triangular radiator and a second connecting point connected to the apex or the fourth triangular radiator.

30. A compact broadband antenna according to claim 29, further comprising a back loading element interposed between the apex of the first triangular radiator and the apex of the second triangular radiator.

31. A compact broadband antenna according to claim 29, further comprising a first back loading element interposed between the apex of the first triangular radiator and a ground voltage reference, and a second back loading element interposed between the apex of the second triangular radiator and the ground voltage reference.

32. A compact broadband antenna according to claim 31, wherein the first back loading element is selected from the group consisting of: an inductor; a parallel combination of an inductor and a resistor; a capacitor; a parallel combination of a capacitor and a resistor; a resistor; and a parallel combination of a resistor, an inductor, and a capacitor.

33. A compact broadband antenna according to claim 31, wherein the second back loading element is selected from the group consisting of: an inductor; a parallel combination of an inductor and a resistor; a capacitor; a parallel combination of a capacitor and a resistor; a resistor; and a parallel combination of a resistor, an inductor, and a capacitor.

34. A compact broadband antenna according to claim 29, wherein the first rectangular radiator, the second rectangular radiator, the first triangular radiator, the second triangular radiator, the third triangular radiator, and the fourth triangular radiator are metallic planar sheets.

35. A compact broadband antenna according to claim 29, wherein the first rectangular radiator, the second rectangular radiator, the first triangular radiator, the second triangular radiator, the third triangular radiator, and the fourth triangular radiator are metallic planar frames.

36. A compact broadband antenna according to claim 29, wherein the first rectangular radiator, the second rectangular radiator, the first triangular radiator, the second triangular radiator, the third triangular radiator, and the fourth triangular radiator are lossy conductive planar sheets for providing a distributed load.

37. A compact broadband antenna according to claim 29, wherein the first rectangular radiator, the second rectangular radiator, the first triangular radiator, the second triangular radiator, the third triangular radiator, and the fourth triangular radiator are lossy conductive planar frames for providing a distributed load.

38. A compact broadband antenna according to claim 29, wherein the first rectangular radiator is shaped so as to bend toward the second rectangular radiator near the second edge of the first rectangular radiator and the second rectangular radiator is shaped so as to bend toward the first rectangular radiator near the second edge of the second rectangular radiator for providing a capacitive load.

39. A compact broadband antenna according to claim 29, wherein the feed connection further comprises: a first input coupling element in a series configuration between the first connecting point and the apex of the third triangular radiator; a second input coupling element in a series configuration between the second connecting point and the apex of the fourth triangular radiator; and an input shunt element connected between the apex of the third triangular radiator and the apex of the fourth triangular radiator.

40. A compact broadband antenna according to claim 39, wherein the first input coupling element is selected from the group consisting of a capacitor, an inductor, and a resistor.

41. A compact broadband antenna according to claim 39, wherein the second input coupling element is selected from the group consisting of a capacitor, an inductor, and a resistor.

42. A compact broadband antenna according to claim 39, wherein the input shunt element is selected from the group consisting of a capacitor, an inductor, and a resistor.

43. A compact broadband antenna according to claim 29, wherein the center of gravity of the antenna is located near the feed connection.

44. A compact broadband antenna according to claim 29, further comprising a dipole array having:

(a) a first feeder transmission line and a second feeder transmission line extending in length from the feed connection to a radiating end of the antenna between the second edge of the first rectangular radiator and the second edge of the second rectangular radiator;

(b) a plurality of dipoles connected to the first feeder transmission line and the second feeder transmission line, each dipole comprising a first monopole element and a second monopole element, each first monopole element extending in opposite directions from each second monopole element, each first and second monopole elements extending axially from the first feeder transmission line and the second feeder transmission line, each first monopole element extends towards and positioned perpendicular to the first rectangular radiator and each second monopole element extends towards and positioned perpendicular to the second rectangular radiator;

(c) the first monopole element of each dipole being alternately connected to the first feeder transmission line and the second feeder transmission line, and the second monopole element of each dipole being alternately connected to the second feeder transmission line and the first feeder transmission line, respectively;

(d) the length of the dipoles and the spacing between the dipoles increasing from a minimum at a position nearest the radiating end to a maximum at a position nearest the feed connection; and (e) an end of the first feeder transmission line nearest to the feed connection being connected to the first connecting point and an end of the second feeder transmission line nearest to the feed connection being connected to the second connecting point.

45. A compact broadband antenna according to claim 44, wherein the end of the first feeder transmission line farthest from the feed connection is coaxially connected to the first connecting point and the end of the second feeder transmission line farthest from the feed connection is coaxially connected to the second connecting point.

* * * * *